United States Patent
Kobayashi (10) Patent No.: US 12,057,338 B2
(45) Date of Patent: Aug. 6, 2024

(54) OVERHEAD CONVEYANCE VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 372 days.

(21) Appl. No.: 17/605,593

(22) PCT Filed: Mar. 13, 2020

(86) PCT No.: PCT/JP2020/011281
§ 371 (c)(1),
(2) Date: Oct. 22, 2021

(87) PCT Pub. No.: WO2020/230440
PCT Pub. Date: Nov. 19, 2020

(65) Prior Publication Data
US 2022/0415686 A1    Dec. 29, 2022

(30) Foreign Application Priority Data

May 13, 2019   (JP) ................................. 2019-090582

(51) Int. Cl.
*H01L 21/677* (2006.01)
*B66C 1/44* (2006.01)
(Continued)

(52) U.S. Cl.
CPC ........ *H01L 21/67733* (2013.01); *B66C 1/445* (2013.01); *B66C 11/00* (2013.01);
(Continued)

(58) Field of Classification Search
CPC ......... H01L 21/67733; H01L 21/67724; H01L 21/6773; H01L 21/67706; B66C 1/445; B66C 19/00
See application file for complete search history.

(56) References Cited

U.S. PATENT DOCUMENTS 9,969,551 B2 * 5/2018 Abe .................. H01L 21/67769
10,640,294 B2 * 5/2020 Kinugawa ............ B65G 19/225
(Continued)

FOREIGN PATENT DOCUMENTS

CN    109160058 A    1/2019
JP      6327124 B2    6/1988
(Continued)

OTHER PUBLICATIONS

Official Communication issued in International Patent Application No. PCT/JP2020/011281, mailed on May 26, 2020.

*Primary Examiner* — Saul Rodriguez
*Assistant Examiner* — Ashley K Romano
(74) *Attorney, Agent, or Firm* — Keating & Bennett, LLP (57) ABSTRACT

An overhead transport vehicle includes a conveyor to travel along a track, a holder to hold an object to be conveyed, and a lifting driver to lift and lower the holder. The holder includes a base, a holder including a body and a pair of grippers connected to the body in an openable/closable manner, the holder being attached to the base so as to be movable along an opening/closing direction of the pair of grippers, and a first elastic member to restrict, between the base and the body, movement of the holder along the opening/closing direction.

8 Claims, 5 Drawing Sheets

(51) Int. Cl.
*B66C 11/00* (2006.01)
*B66C 19/00* (2006.01)

(52) U.S. Cl.
CPC .. *H01L 21/67706* (2013.01); *H01L 21/67724* (2013.01); *H01L 21/6773* (2013.01); *B66C 19/00* (2013.01)

(56) References Cited

U.S. PATENT DOCUMENTS

| | | | |
|---|---|---|---|
| 10,643,877 B2 * | 5/2020 | Ogo | H01L 21/67706 |
| 2006/0180565 A1 * | 8/2006 | Nakao | B66C 13/06 |
| | | | 212/332 |
| 2012/0118845 A1 * | 5/2012 | Wada | H01L 21/6773 |
| | | | 212/71 |
| 2016/0133488 A1 | 5/2016 | Tomida | |
| 2017/0243775 A1 | 8/2017 | Kobayashi | |
| 2019/0241406 A1 | 8/2019 | Kobayashi | |

FOREIGN PATENT DOCUMENTS

| | | |
|---|---|---|
| JP | 2017-145134 A | 8/2017 |
| JP | 2018-039659 A | 3/2018 |
| WO | 2018/079146 A1 | 5/2018 |

\* cited by examiner

OVERHEAD CONVEYANCE VEHICLE

BACKGROUND OF THE INVENTION

1. Field of the Invention

The present disclosure relates to an overhead transport vehicle.

2. Description of the Related Art

An overhead transport vehicle is known in which, in a holding unit configured to hold an object to be conveyed, a holding part including a pair of gripping sections is disposed on an elastic member in order to prevent vibrations in the vertical direction and the horizontal direction from being transmitted to the object to be conveyed (see Japanese Patent No. 6327124, for example).

SUMMARY OF THE INVENTION

However, in the above-described overhead transport vehicle, because transmission of vibrations to the object to be conveyed is prevented by disposing the holding part on the elastic member, it is difficult to effectively prevent vibrations in one direction along the horizontal direction from being transmitted to the object to be conveyed.

Preferred embodiments of the present invention provide overhead transport vehicles that each can, with a simple configuration, effectively prevent vibrations in one direction along the horizontal direction from being transmitted to an object to be conveyed.

An overhead transport vehicle according to one aspect of a preferred embodiment of the present disclosure includes a conveyor to travel along a track, a holder to hold an object to be conveyed, and a lifting driver to lift and lower the holder. The holder includes a base, a holder including a body and a pair of grippers connected to the body in an openable/closable manner, the holder being attached to the base so as to be movable along an opening/closing direction of the pair of grippers, and a first elastic member to restrict movement of the holder along the opening/closing direction between the base and the body.

In this overhead transport vehicle, the holder is attached to the base so as to be movable along the opening/closing direction of the pair of grippers, and the first elastic member restricts movement of the holder along the opening/closing direction of the pair of grippers between the base and the body of the holder. With this configuration, vibrations in the opening/closing direction of the pair of grippers as vibrations in one direction along the horizontal direction can be absorbed by the first elastic member. Furthermore, by matching the moving direction of the holder relative to the base with the opening/closing direction of the pair of grippers, the configuration can be simplified. Thus, with this overhead transport vehicle, vibrations in the one direction along the horizontal direction can be effectively prevented with the simple configuration from being transmitted to the object to be conveyed.

In an overhead transport vehicle according to an aspect of a preferred embodiment of the present disclosure, the holder may further include a linear-motion guide to guide the pair of grippers in an openable/closable manner and guide the holder in a movable manner. Thus, by causing the linear-motion mechanism to perform multiple functions of guiding the pair of grippers and guiding the holder, the configuration can be simplified.

In an overhead transport vehicle according to an aspect of a preferred embodiment of the present disclosure, the opening/closing direction may be aligned along a traveling direction of the conveyor. With this configuration, vibrations in the traveling direction that may occur when the overhead transport vehicle accelerates or decelerates or when the overhead transport vehicle passes over slight irregularities on the track, for example, can be prevented from being transmitted to the object to be conveyed.

In an overhead transport vehicle according to an aspect of a preferred embodiment of the present disclosure, the holder may further include a connector connected to a lower end portion of a belt included in the lifting driver, and a second elastic member between a portion of the connector located below the base and the base. With this configuration, vertical vibrations that may occur when the holder places the object to be conveyed onto a destination or when the overhead transport vehicle passes over slight irregularities on the track, for example, can be prevented from being transmitted to the object to be conveyed.

According to preferred embodiments of the present disclosure, it is possible to provide overhead transport vehicles that each can, with a simple configuration, effectively prevent vibrations in the one direction along the horizontal direction from being transmitted to the object to be conveyed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present disclosure will now be described in detail with reference to the drawings. Like or equivalent elements are designated by like reference signs in each drawing, and duplicate description is omitted.

Figure 1:
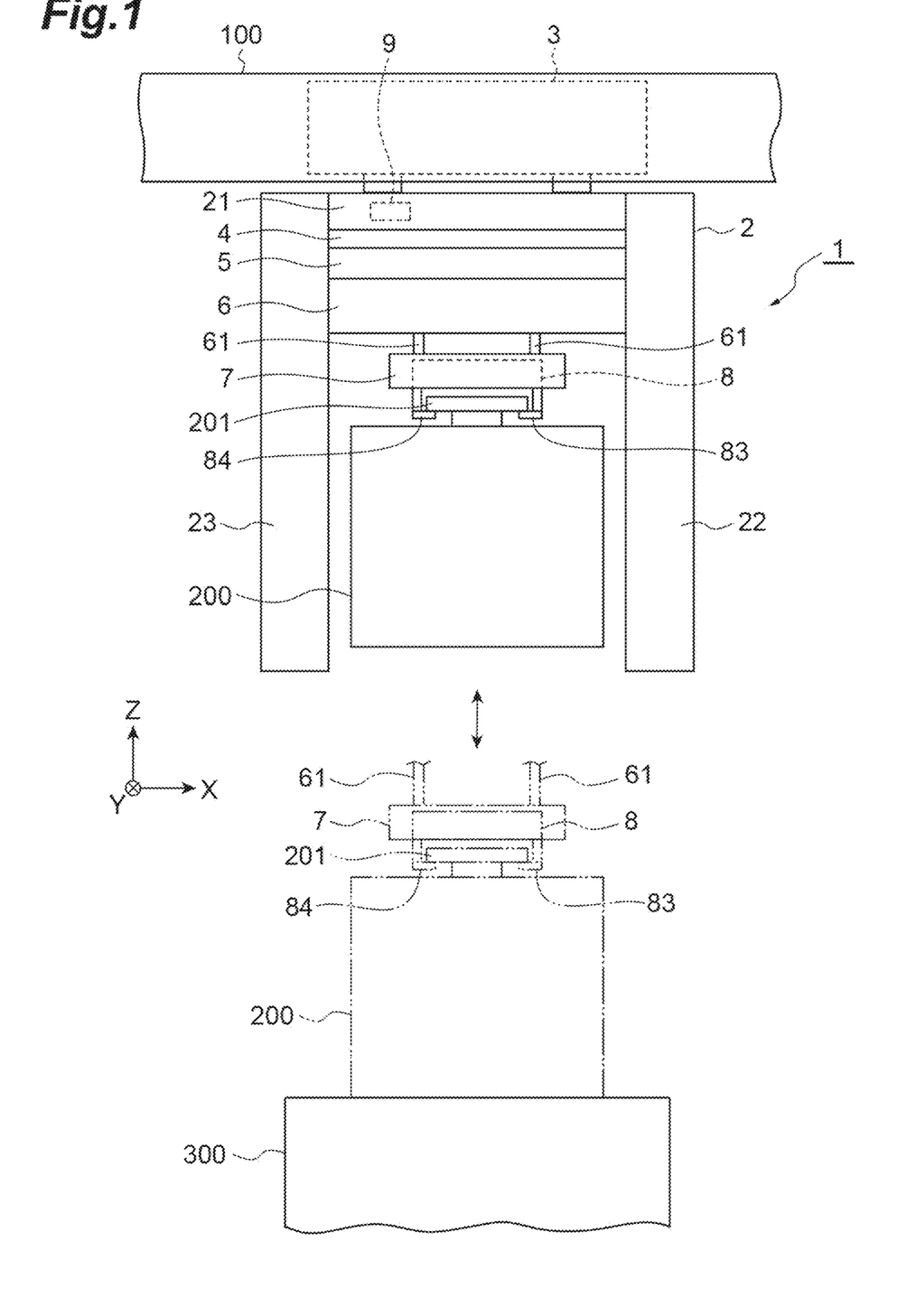
FIG. 1 is a side view of an overhead transport vehicle according to a preferred embodiment of the present invention.

As illustrated in FIG. 1, an overhead transport vehicle 1 travels along a track 100 installed near a ceiling of a clean room where semiconductor devices are manufactured. The overhead transport vehicle 1 conveys a front opening unified pod (FOUP) (object to be conveyed) 200 in which a plurality of semiconductor wafers are accommodated and transfers the FOUP 200 to or from a load port (destination) 300 provided to a processing device configured to perform various processes on semiconductor wafers. In the following description, the vertical direction is called "Z-axis direction", the direction in which the track 100 extends is called "X-axis direction", and the direction orthogonal to the Z-axis direction and the X-axis direction is called "Y-axis direction". In the present preferred embodiment, the track 100 extends along the horizontal direction.

The overhead transport vehicle 1 includes a frame unit 2, a traveling unit 3, a lateral unit 4, a theta unit 5, a lifting drive unit 6, a holding unit 7, and a controller 9. The frame unit 2 includes a center frame 21, a front frame 22, and a rear frame 23. The front frame 22 extends downward from a front end portion of the center frame 21 (on the front side in the traveling direction of the overhead transport vehicle 1). The rear frame 23 extends downward from a rear end portion of the center frame 21 (on the rear side in the traveling direction of the overhead transport vehicle 1).

The traveling unit 3 is disposed above the center frame 21. The traveling unit 3 receives power supplied from a high frequency current cable that is laid along the track 100 in a non-contact manner, for example, thus traveling along the track 100. The lateral unit 4 is disposed under the center frame 21. The lateral unit 4 moves the theta unit 5, the lifting drive unit 6, and the holding unit 7 in a lateral direction (laterally in the traveling direction of the overhead transport vehicle 1). The theta unit 5 is disposed under the lateral unit 4. The theta unit 5 rotates the lifting drive unit 6 and the holding unit 7 in a horizontal plane.

The lifting drive unit 6 is disposed under the theta unit 5. The lifting drive unit 6 lifts and lowers the holding unit 7. More specifically, the lifting drive unit 6 lifts the holding unit 7 by winding a plurality of belts 61 by which the holding unit 7 is suspended, and lowers the holding unit 7 by paying out the belts 61 by which the holding unit 7 is suspended. The holding unit 7 is disposed below the lifting drive unit 6. The holding unit 7 holds a FOUP 200. More specifically, the holding unit 7 holds the FOUP 200 with a holding part 8 thereof holding a flange 201 of the FOUP 200. The controller 9 is disposed in the center frame 21. The controller 9 is an electronic control unit configured with a CPU, a ROM, and a RAM, for example. The controller 9 is configured or programmed to control the respective components of the overhead transport vehicle 1.

As one example, the overhead transport vehicle 1 configured as described above operates as follows. When a FOUP 200 is transferred from a load port 300 to the overhead transport vehicle 1, the overhead transport vehicle 1 holding no FOUP 200 stops above the load port 300. Subsequently, the lifting drive unit 6 lowers the holding unit 7, and the holding part 8 holds the flange 201 of the FOUP 200 placed on the load port 300. Subsequently, the lifting drive unit 6 lifts the holding unit 7 to carry the FOUP 200 between the front frame 22 and the rear frame 23. Subsequently, the overhead transport vehicle 1 holding the FOUP 200 starts traveling.

By contrast, when a FOUP 200 is transferred from the overhead transport vehicle 1 to the load port 300, the overhead transport vehicle 1 holding a FOUP 200 stops above the load port 300. Subsequently, the lifting drive unit 6 lowers the holding unit 7, places the FOUP 200 on the load port 300, and the holding part 8 releases holding of the flange 201 of the FOUP 200. Subsequently, the lifting drive unit 6 lifts the holding unit 7. Subsequently, the overhead transport vehicle 1 holding no FOUP 200 starts traveling.

Figure 2:
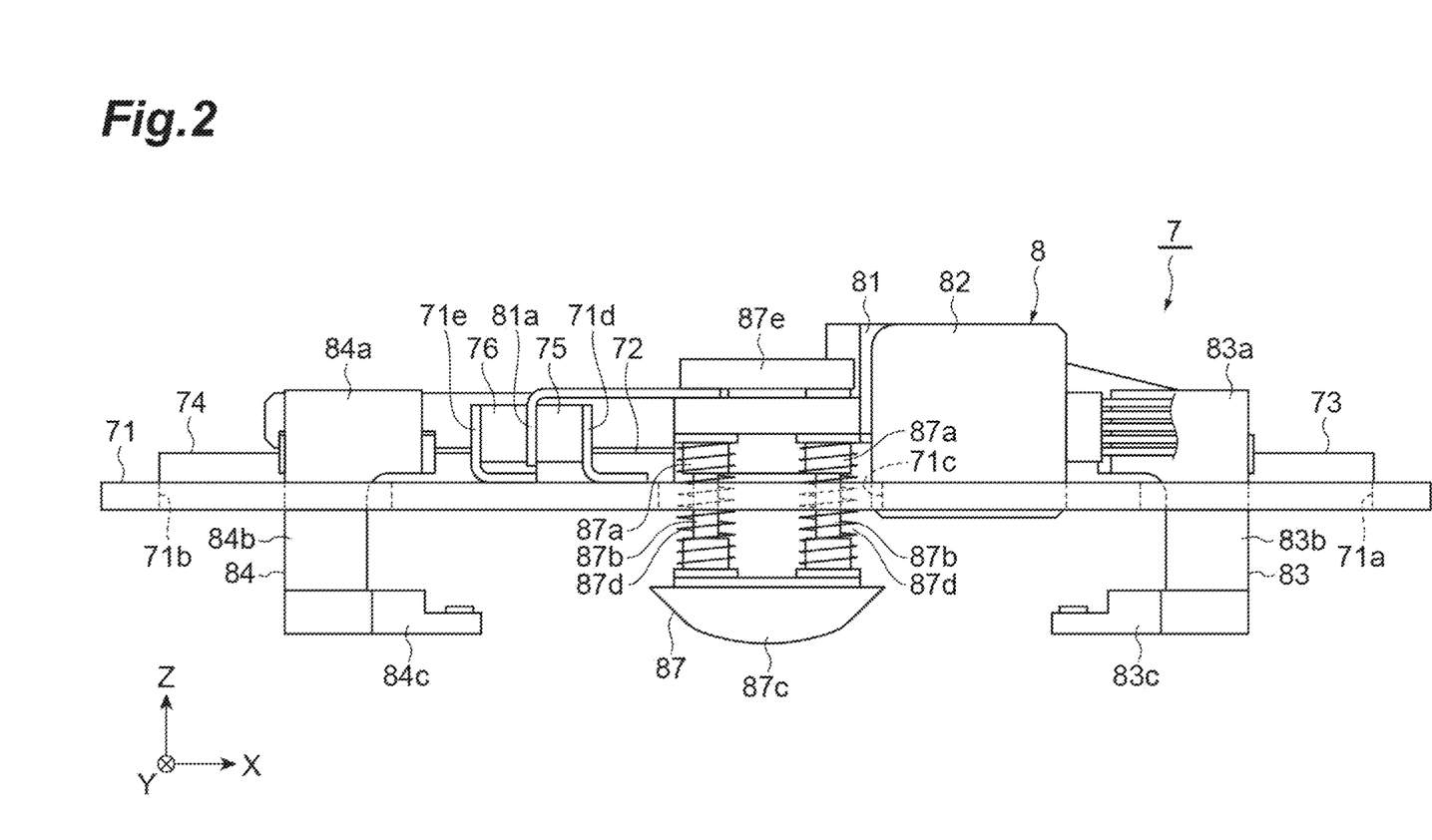
FIG. 2 is a side view of a holding unit illustrated in FIG. 1.
Figure 3:
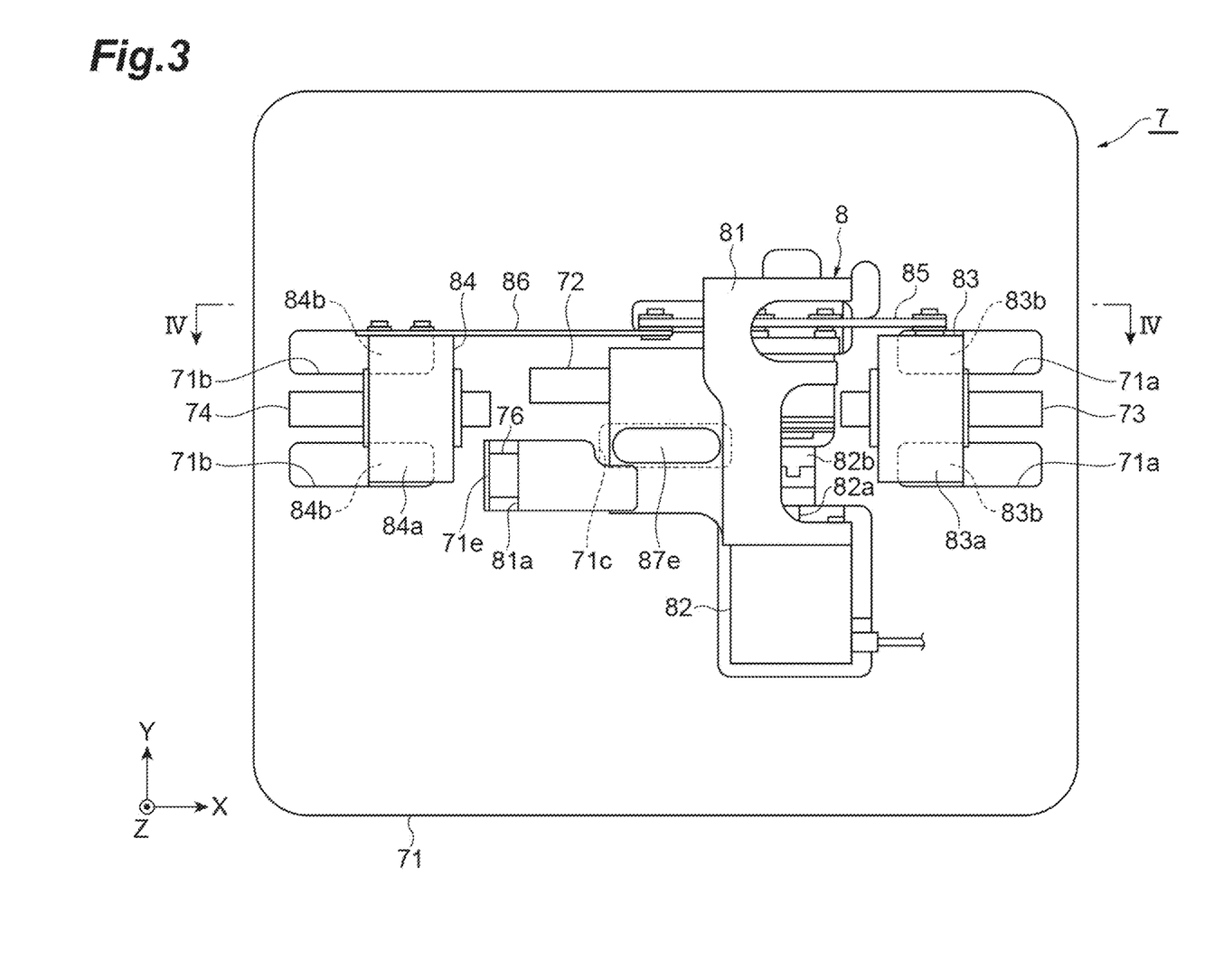
FIG. 3 is a plan view of the holding unit illustrated in FIG. 2.

The following describes the configuration of the holding unit 7 in detail. As illustrated in FIG. 2 and FIG. 3, the holding unit 7 includes a base 71 and a plurality of linear-motion mechanisms 72, 73, 74 in addition to the holding part 8. The holding part 8 is attached to the base 71 with the linear-motion mechanisms 72, 73, 74 interposed therebetween. The respective linear-motion mechanisms 72, 73, 74 support the respective components of the holding part 8 such that these components are movable only along the X-axis direction. In the present preferred embodiment, the respective linear-motion mechanisms 72, 73, 74 are linear guides configured such that linear blocks thereof slide along rails. Herein, the holding part 8, the linear-motion mechanisms 72, 73, 74, and the like disposed on the base 71 are covered by a cover (not illustrated).

The holding part 8 includes a body section 81, a drive motor 82, a pair of gripping sections 83, 84, a pair of link mechanisms 85, 86, and a center cone unit 87. The body section 81 is fixed to the linear block of the linear-motion mechanism 72. The drive motor 82 is fixed to the body section 81 such that a rotating shaft 82a thereof extends along the Y-axis direction. To the body section 81, for example, a brake mechanism 82b configured to maintain a state in which the rotating shaft 82a is stationary is also attached.

The gripping section 83 is disposed on one side of the body section 81 in the X-axis direction. The gripping section 83 includes a support section 83a, a pair of coupling sections 83b, and a claw 83c. The support section 83a is fixed to the linear block of the linear-motion mechanism 73. The pair of coupling sections 83b extend from the support section 83a to below the base 71 through a pair of slits 71a. The pair of slits 71a are provided in the base 71 on both sides of the linear-motion mechanism 73 so as to extend in the X-axis direction along the linear-motion mechanism 73. The claw 83c is engageable with the flange 201 of a FOUP 200, and is fixed to lower end portions of the pair of coupling sections 83b below the base 71.

The gripping section 84 is disposed on the other side of the body section 81 in the X-axis direction (on a side opposite to the gripping section 83 with respect to the body section 81). The gripping section 84 includes a support section 84a, a pair of coupling sections 84b, and a claw 84c. The support section 84a is fixed to the linear block of the linear-motion mechanism 74. The pair of coupling sections 84b extend from the support section 84a to below the base 71 through a pair of slits 71b. The pair of slits 71b are located in the base 71 on both sides of the linear-motion mechanism 74 so as to extend in the X-axis direction along the linear-motion mechanism 74. The claw 84c is engageable with the flange 201 of a FOUP 200, and is fixed to lower end portions of the pair of coupling sections 84b below the base 71.

Figure 4:
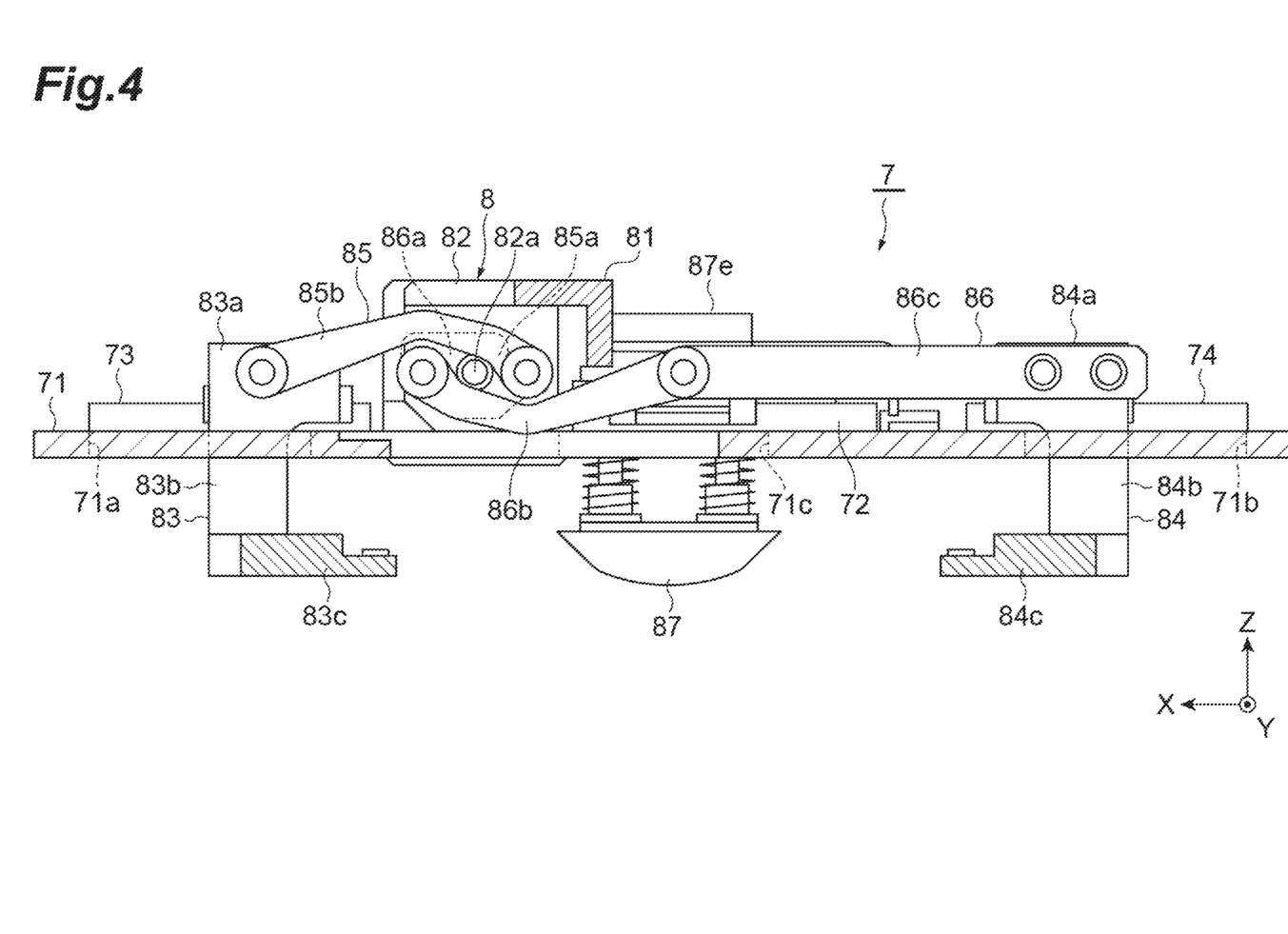
FIG. 4 is a sectional view taken along line IV-IV illustrated in FIG. 3.

As illustrated in FIG. 4, the link mechanism 85 connects the rotating shaft 82a of the drive motor 82 and the support section 83a of the gripping section 83. More specifically, the link mechanism 85 includes a first link 85a and a second link 85b. One end portion of the first link 85a is fixed to the rotating shaft 82a. One end portion of the second link 85b is rotatably attached to the other end portion of the first link 85a. The other end portion of the second link 85b is rotatably attached to a pin provided to the support section 83a.

The link mechanism 86 connects the rotating shaft 82a of the drive motor 82 and the support section 84a of the gripping section 84. More specifically, the link mechanism 86 includes a first link 86a, a second link 86b, and a third link 86c. One end portion of the first link 86a is fixed to the rotating shaft 82a. One end portion of the second link 86b is rotatably attached to the other end portion of the first link 86a. The other end portion of the second link 86b is rotatably attached to one end portion of the third link 86c. The other end portion of the third link 86c is fixed to the support section 84a. In the present preferred embodiment, the first link 85a and the first link 86a are integrally formed.

When the pair of gripping sections 83, 84 hold the flange 201 of a FOUP 200, the rotating shaft 82a of the drive motor 82 is rotated in one direction (clockwise in FIG. 4), such that the pair of gripping sections 83, 84 are closed along the X-axis direction due to actions of the pair of link mechanisms 85, 86. When the pair of gripping sections 83, 84 release holding of the flange 201, the rotating shaft 82a of the drive motor 82 is rotated in the other direction (counterclockwise in FIG. 4), whereby the pair of gripping sections 83, 84 are opened along the X-axis direction due to actions of the pair of link mechanisms 85, 86.

As illustrated in FIG. 2 and FIG. 3, the center cone unit 87 includes a pair of guides 87a, a pair of rods 87b, a center cone 87c, and a pair of coil springs 87d. The pair of guides 87a are fixed to the body section 81 in a manner aligned in the X-axis direction. Each guide 87a is a tubular member extending in the Z-axis direction. The pair of rods 87b are each inserted into the pair of guides 87a. Upper ends of the respective rods 87b are connected to each other by a coupling member 87e. The pair of rods 87b extend from the pair of guides 87a to below the base 71 through a slit 71c. The slit 71c is provided in the base 71 so as to extend in the X-axis direction along the linear-motion mechanism 72.

The center cone 87c is fixed to lower ends of the respective rods 87b below the base 71. The pair of coil springs 87d are each disposed between the pair of guides 87a and the center cone 87c with the pair of rods 87b each inserted thereinto. The pair of coil springs 87d bias the center cone 87c downward with respect to the body section 81. In the center cone unit 87, in order to position the holding part 8 with respect to the flange 201 of a FOUP 200 when the holding part 8 holds the flange 201, the center cone 87c is fitted into a depression in the flange 201.

In the holding part 8 configured as described above, the pair of gripping sections 83, 84 are connected to the body section 81 so as to be openable and closable along the X-axis direction, and thus the entire holding part 8 is attached to the base 71 so as to be movable along the X-axis direction that is the opening/closing direction of the pair of gripping sections 83, 84. Specifically, the linear-motion mechanisms 73, 74 guide the pair of gripping sections 83, 84 in an openable/closable manner along the X-axis direction, and guide the holding part 8 in a movable manner along the X-axis direction. In the present preferred embodiment, the opening/closing direction of the pair of gripping sections 83, 84 and the moving direction of the holding part 8 are aligned along the X-axis direction that is the traveling direction of the traveling unit 3 (i.e., the direction in which the track 100 extends).

The holding unit 7 further includes a plurality of first elastic members 75, 76. The first elastic member 75 is disposed between a movable plate 81a and a stopper plate 71d. The first elastic member 76 is disposed between the movable plate 81a and a stopper plate 71e. The movable plate 81a is provided to the body section 81 so as to be located between the body section 81 and the gripping section 84, and is movable together with the body section 81 along the X-axis direction. The stopper plate 71d is provided to the base 71 so as to be located closer to the gripping section 83 than the movable plate 81a is, and faces the movable plate 81a in the X-axis direction. The stopper plate 71e is provided to the base 71 so as to be located closer to the gripping section 84 than the movable plate 81a is, and faces the movable plate 81a in the X-axis direction. The first elastic members 75, 76 each are a gel material, a rubber material, or a compression spring, for example.

When the holding part 8 moves along the X-axis direction such that the movable plate 81a approaches the stopper plate 71d, the first elastic member 75 is compressed, and movement of the holding part 8 is restricted by repulsive force of the compressed first elastic member 75. When the holding part 8 moves along the X-axis direction such that the movable plate 81a approaches the stopper plate 71e, the first elastic member 76 is compressed, and movement of the holding part 8 is restricted by a repulsive force provided by the compressed first elastic member 76. In this manner, the first elastic members 75, 76 restrict, between the base 71 and the body section 81, movement of the holding part 8 along the X-axis direction.

Figure 5:
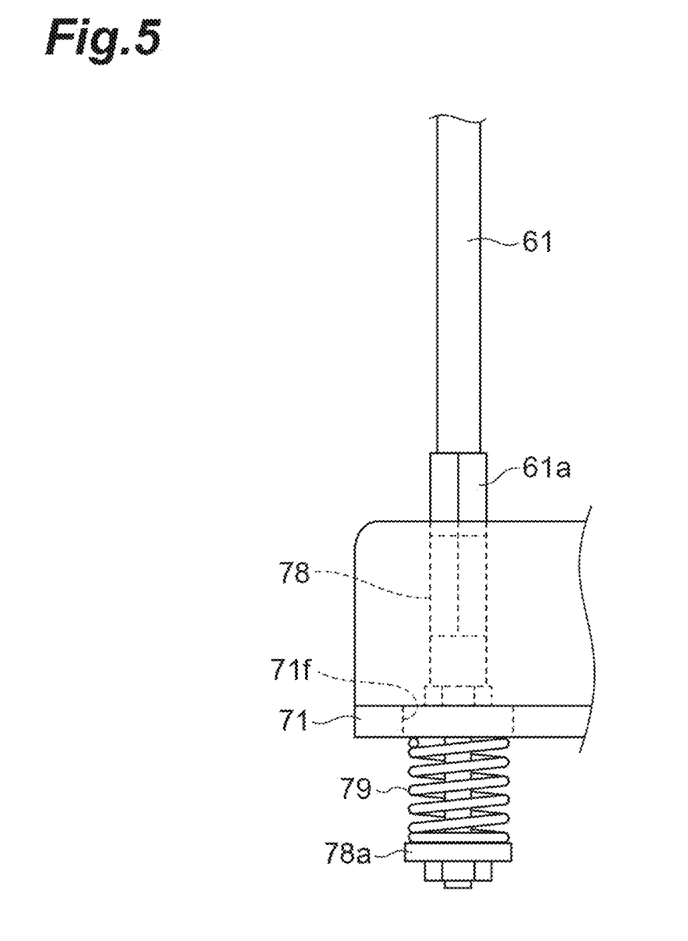
FIG. 5 is an enlarged view of a portion of the holding unit illustrated in FIG. 1.

As illustrated in FIG. 5, the holding unit 7 further includes a connecting member 78 and a second elastic member 79. The connecting member 78 is provided so as to correspond to each belt 61 of the lifting drive unit 6. A lower end portion 61a of the corresponding belt 61 is connected to the connecting member 78. The connecting member 78 extends to below the base 71 through an opening 71f in the base. The second elastic member 79 is disposed between a portion 78a of the connecting member 78 located below the base 71 and the base 71. The second elastic member 79 is a gel material, a rubber material, or a compression spring, for example. The connecting members 78 corresponding to the belts 61 are connected to each other by a link mechanism (not illustrated) to prevent twisting about the Z-axis. In FIG. 2, FIG. 3, and FIG. 4, illustration of the connecting members 78 and the second elastic members 79 is omitted.

As described above, in the overhead transport vehicle 1, the holding part 8 is attached to the base 71 so as to be movable along the X-axis direction that is the opening/closing direction of the pair of gripping sections 83, 84, and the first elastic members 75, 76 restrict, between the base 71 and the body section 81 of the holding part 8, movement of the holding part 8 along the X-axis direction that is the opening/closing direction of the pair of the gripping sections 83, 84. With this configuration, vibrations in the X-axis direction as vibrations in one direction along the horizontal direction can be absorbed by the first elastic members 75, 76. Furthermore, by matching the moving direction of the holding part 8 relative to the base 71 with the opening/closing direction of the pair of gripping sections 83, 84, the configuration can be simplified. Thus, the overhead transport vehicle 1 can effectively prevent vibrations in the one direction along the horizontal direction from being transmitted to the FOUP 200 with the simple configuration.

In the overhead transport vehicle 1, the linear-motion mechanisms 73, 74 guide the pair of gripping sections 83, 84 in an openable/closable manner and guide the holding part 8 in a movable manner. Thus, by causing the linear-motion mechanisms 73, 74 to perform multiple functions of guiding the pair of gripping sections 83, 84 and guiding the holding part 8, the configuration can be simplified.

In the overhead transport vehicle 1, the opening/closing direction of the pair of gripping sections 83, 84 and the moving direction of the holding part 8 are aligned along the X-axis direction that is the traveling direction of the traveling unit 3. With this configuration, vibrations in the traveling direction that may occur when the overhead transport vehicle 1 is accelerates or decelerate or when the overhead transport vehicle 1 passes over slight irregularities on the track 100, for example, can be prevented from being transmitted to the FOUP 200.

In the overhead transport vehicle 1, the lower end portion 61a of each belt 61 that the lifting drive unit 6 includes is connected to the corresponding connecting member 78, and the corresponding second elastic member 79 is disposed between the portion of the connecting member 78 located below the base 71 and the base 71. With this configuration, vertical vibrations that may occur when the holding unit 7 places the FOUP 200 on the load port 300 or when the overhead transport vehicle 1 passes over slight irregularities on the track 100, for example, can be prevented from being transmitted to the FOUP 200.

While the preferred embodiments of the present disclosure has been described above, the present disclosure is not limited to the above preferred embodiments. For example, the object to be conveyed in the present disclosure is not limited to the FOUP 200, and may be another article such as a reticle pod in which a plurality of glass substrates are accommodated. The track along which the overhead transport vehicles according to preferred embodiments of the present disclosure travel is not limited to the track 100 installed near the ceiling of the clean room where semiconductor devices are manufactured, and may be a track installed near a ceiling of another facility. The opening/closing direction of the pair of gripping sections 83, 84 and the moving direction of the holding part 8 do not have to be aligned along the traveling direction of the traveling unit 3. The rails of the respective linear-motion mechanisms 72, 73, 74 may be integrally formed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle comprising:
   a conveyor to travel along a track;
   a holder to hold an object to be conveyed; and
   a lifting driver to lift and lower the holder; wherein
   the holder includes:
      a base;
      a holding portion including a body and a pair of grippers connected to the body in an openable/closable manner, the holding portion attached to the base so as to be movable along an opening/closing direction of the pair of grippers; and
      a pair of first elastic members to restrict, between the base and the body, movement of the holding portion along the opening/closing direction;
   a movable plate is provided to the body so as to be located between the body and one of the pair of grippers;
   a first stopper plate and a second stopper plate are provided to the base, the first stopper plate located closer to a first of the pair of grippers than the movable plate and facing the movable plate in the opening/closing direction, the second stopper plate located closer to a second of the pair of grippers than the movable plate and facing the movable plate in the opening/closing direction;
   a first of the pair of first elastic members is between the movable plate and the first stopper plate; and
   a second of the pair of first elastic members is between the movable plate and the second stopper plate.

2. The overhead transport vehicle according to claim 1, wherein the holder further includes a linear-motion mechanism to guide the pair of grippers in an openable/closable manner and guide the holding portion in a movable manner.

3. The overhead transport vehicle according to claim 2, wherein the opening/closing direction extends along a traveling direction of the conveyor.

4. The overhead transport vehicle according to claim 3, wherein the holder further includes:
   a connector connected to a lower end portion of a belt included in the lifting driver; and
   a second elastic member between the base and a portion of the connector located below the base.

5. The overhead transport vehicle according to claim 2, wherein the holder further includes:
   a connector connected to a lower end portion of a belt included in the lifting driver; and
   a second elastic member between the base and a portion of the connector located below the base.

6. The overhead transport vehicle according to claim 1, wherein the opening/closing direction extends along a traveling direction of the conveyor.

7. The overhead transport vehicle according to claim 6, wherein the holder further includes:
   a connector connected to a lower end portion of a belt included in the lifting driver; and
   a second elastic member between the base and a portion of the connector located below the base.

8. The overhead transport vehicle according to claim 1, wherein the holder further includes:
   a connector connected to a lower end portion of a belt included in the lifting driver; and
   a second elastic member between the base and a portion of the connector located below the base.

* * * * *